United States Patent
Makabe et al.

(10) Patent No.: US 7,947,578 B2
(45) Date of Patent: May 24, 2011

(54) METHOD FOR FABRICATING SEMICONDUCTOR DEVICE

(75) Inventors: Isao Makabe, Kanagawa (JP); Ken Nakata, Kanagawa (JP); Tsuyoshi Kouichi, Kanagawa (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 0 days.

(21) Appl. No.: 12/750,011

(22) Filed: Mar. 30, 2010

(65) Prior Publication Data

US 2010/0248459 A1 Sep. 30, 2010

(30) Foreign Application Priority Data

Mar. 31, 2009 (JP) .................................. 2009-087933

(51) Int. Cl.
*H01L 21/20* (2006.01)
*H01L 21/36* (2006.01)
(52) U.S. Cl. ........................ 438/478; 438/507
(58) Field of Classification Search .................. None
See application file for complete search history.

(56) References Cited

U.S. PATENT DOCUMENTS

| | | | | |
|---|---|---|---|---|
| 3,634,149 A * | 1/1972 | Knippenberg et al. | ......... | 117/87 |
| 3,869,322 A * | 3/1975 | Cuomo et al. | ......... | 438/509 |
| 5,270,263 A * | 12/1993 | Kim et al. | ......... | 438/702 |
| 5,767,027 A * | 6/1998 | Sakon et al. | ......... | 501/98.4 |
| 6,617,060 B2 | 9/2003 | Weeks, Jr. et al. | | |
| 6,649,287 B2 | 11/2003 | Weeks, Jr. et al. | | |
| 2004/0119067 A1 | 6/2004 | Weeks, Jr. et al. | | |
| 2006/0027896 A1 * | 2/2006 | Fujiwara et al. | ......... | 257/615 |
| 2006/0244011 A1 * | 11/2006 | Saxler | ......... | 257/194 |
| 2006/0280668 A1 * | 12/2006 | Dmitriev et al. | ......... | 423/412 |
| 2008/0054248 A1 * | 3/2008 | Chua et al. | ......... | 257/14 |
| 2008/0233721 A1 * | 9/2008 | Kosaka et al. | ......... | 438/493 |
| 2009/0085166 A1 * | 4/2009 | Iwamuro | ......... | 257/615 |
| 2009/0104758 A1 | 4/2009 | Weeks, Jr. et al. | | |

FOREIGN PATENT DOCUMENTS

| | | |
|---|---|---|
| JP | 2004-524250 A | 8/2004 |
| JP | 2009-7205 A | 1/2009 |
| WO | 02/48434 A2 | 6/2002 |
| WO | 2008/048303 A2 | 4/2008 |

OTHER PUBLICATIONS

European Search Report dated Jul. 22, 2010, issued in corresponding European Application No. 10158830.9.

* cited by examiner

*Primary Examiner* — Scott B Geyer
(74) *Attorney, Agent, or Firm* — Westerman, Hattori, Daniels & Adrian, LLP

(57) ABSTRACT

A method for fabricating a semiconductor device including: cleaning an apparatus used to grow a layer including Ga; performing a first step of forming a first layer on a substrate made of silicon by using the apparatus, the first layer including a nitride semiconductor that does not include Ga as a composition element and has a Ga impurity concentration of $2 \times 10^{18}$ atoms/cm$^3$ or less; and performing a second step of forming a second layer on the first layer by using the apparatus after the first step is repeatedly carried out multiple times, the second layer including a nitride semiconductor including Ga.

20 Claims, 10 Drawing Sheets

METHOD FOR FABRICATING SEMICONDUCTOR DEVICE

CROSS-REFERENCE TO RELATED APPLICATION

This application is based upon and claims the benefit of priority of the prior Japanese Patent Application No. 2009-087933, filed on Mar. 31, 2009, the entire contents of which are incorporated herein by reference.

BACKGROUND (i) Technical Field

The present invention relates to a method for fabricating a semiconductor device, and more particularly, to a method for fabricating a semiconductor device having a semiconductor layer that includes gallium (Ga) and is formed on a silicon (Si) substrate by a vapor deposition method.

(ii) Related Art

A semiconductor device using a nitride semiconductor layer including Ga (gallium) as a composition element (GaN-based semiconductor layer) has attracted attention as devices capable of operating at high frequencies. An example of such a semiconductor device is a HEMT (High Electron Mobility Transistor). This type of semiconductor device frequently employs a silicon carbide (SiC) substrate or a sapphire substrate. Since these substrates are expensive, it is desired to develop a method for forming a semiconductor device having a GaN-based semiconductor layer on the silicon substrate. An MBE (Molecular Beam Epitaxy) method grows layers under high vacuum and has a difficulty in handling a source material of nitrogen. In contrast, an MOCVD (Metal Organic Chemical Vapor Deposition) method grows layers under reduced pressure or ordinary pressure, and handles $NH_3$ and $NH_2$ as a source material of nitrogen easily. Thus, the MOCVD method is widely used to grow GaN-based semiconductors. Japanese Laid-Open Patent Publication No. 2004-524250 discloses a method that includes the steps of providing a buffer layer made of AlN (aluminum nitride) on a silicon substrate and providing a semiconductor layer (channel layer) on the buffer layer by the MOCVD method.

SUMMARY OF THE INVENTION

It is an object of the present invention to provide a method for fabricating a semiconductor device capable of restraining a deterioration of the semiconductor device due to an unwanted conductive layer containing Ga.

According to an aspect of the present invention, there is provided A method for fabricating a semiconductor device including: cleaning an apparatus used to grow a layer including Ga; performing a first step of forming a first layer on a substrate made of silicon by using the apparatus, the first layer including a nitride semiconductor that does not include Ga as a composition element and has a Ga impurity concentration of 2×1018 atoms/cm3 or less; and performing a second step of forming a second layer on the first layer by using the apparatus after the first step is repeatedly carried out multiple times, the second layer including a nitride semiconductor including Ga.

According to another aspect of the present invention, there is provided a method for fabricating a semiconductor device including: performing a first step of forming a first layer on a substrate made of silicon by using an apparatus, the first layer including a nitride semiconductor that does not include Ga as a composition element and has a Ga impurity concentration of 2×1018 atoms/cm3 or less; and performing a second step of forming a second layer on the first layer by using another apparatus, the second layer including a nitride semiconductor including Ga.

DETAILED DESCRIPTION

An embodiment of the present invention is made taking the following into consideration. In a case where a GaN-based semiconductor is grown on the silicon substrate by a vapor deposition method such as MOCVD or HVPE (Hydride Vapor Phase Epitaxy), a high growth temperature of 900° C. or more is used. Such a high temperature is different from that used in growth by MBE or growth of a GaAs-based semiconductor. The high growth temperature causes Ga to easily diffuse in the silicon substrate. The diffused Ga may form a conductive layer in the silicon substrate. The conductive layer increases the parasitic capacitance and increases the loss of high-frequency signals. Thus, the semiconductor device has deteriorated characteristics.

According to an aspect of the embodiment, it is possible to restrain the conductive layer from being formed in the silicon substrate and to prevent the characteristics of the semiconductor device from being deteriorated.

Figure 1:
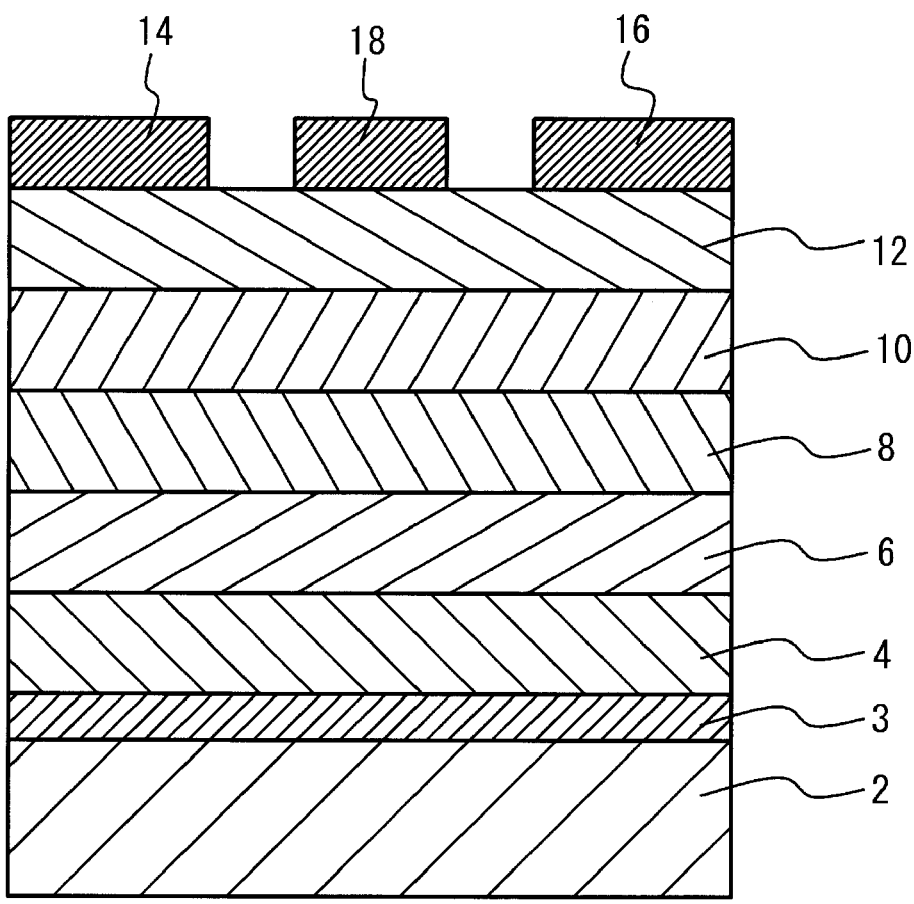
FIG. 1 is a cross-sectional view of a semiconductor device in accordance with a comparative example.

Now, a comparative example is described. FIG. 1 is a cross-sectional view of a semiconductor device in accordance with a comparative example.

Referring to FIG. 1, an AlN layer 4 is formed on a silicon substrate 2. The AlN layer 4 does not include Ga as a composition element and has a Ga impurity concentration of $2 \times 10^{18}$ atoms/cm$^3$ or less. An AlGaN layer 6, which is a nitride semiconductor including Ga as a composition element, is formed on the AlN layer 4. A GaN layer 8 is provided on the AlGaN layer 6. An AlGaN layer 10 is provided on the GaN layer 8, and a GaN layer 12 is provided on the AlGaN layer 10. A source electrode 14, a drain electrode 16 and a gate electrode 18 are provided on the GaN layer 12. Each of the source electrodes 14 and the drain electrode 16 is formed by metals of AuGe/Ni/Au in which AuGe is closest to the GaN layer 12. The gate electrode 18 is formed by metals of WSi/Ti/Au in which WSi is closest to the GaN layer 12.

The AlN layer 4 and the AlGaN layer 6 function as buffer layers. The GaN layer 8 functions as a channel layer, and the AlGaN layer 10 functions as a supply layer. The GaN layer 12 functions as a cap layer. The semiconductor device illustrated in FIG. 1 is a HEMT. The AlN layer 4 functions as a buffer layer that suppresses diffusion of Ga and prevents Ga in the GaN-based semiconductor layers from diffusing in the silicon substrate 2.

However, the semiconductor device of the comparative example has a problem such that a conductive layer 3 is formed in the substrate 2 irrespective of the presence of the buffer layer 4. Thus, a leakage path is formed and the parasitic capacitance is increased. In this case, high-frequency signals may have increasing loss, and the characteristics of the semiconductor device may deteriorate. The conductive layer 3 is formed by the following cause.

In the process of fabricating the semiconductor device of the comparative example, the step of forming the AlN layer 4 and the step of forming the GaN-based semiconductor layers are successively carried out. Thus, in a case where the MOCVD growing step is repeatedly applied to multiple wafers, the wavers loaded in the MOCVD apparatus are subjected to the steps of forming the AlN layer and forming the GaN-based semiconductor layers, and are removed from the MOCVD apparatus. Then, next wafers are loaded in the MOCVD apparatus. An impurity that includes Ga may remain in the MOCVD apparatus when the next wafers are subjected to the step of forming the AlN layer 4. In this case, Ga is taken in during the growth of AlN and may diffuse in the substrate. Thus, the conductive layer 3 including Ga is formed.

The residual of the impurity including Ga in the MOCVD apparatus may be restrained by separating the step of forming the AlN layer 4 and the step of forming the GaN-based semiconductor layers from each other. For example, after the step of forming the AlN layer 4 is repeatedly carried out, the step of forming the GaN-based semiconductor layers is carried out.

Figure 2:
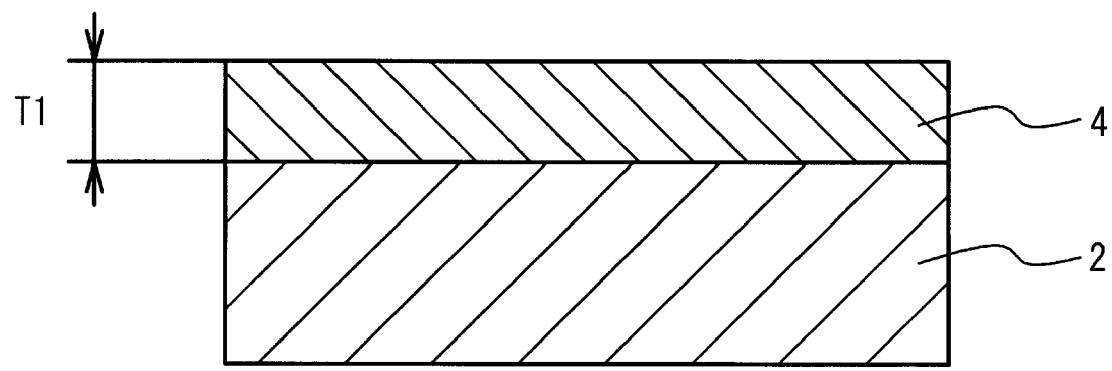
FIG. 2 is a cross-sectional view of a sample used in an experiment.

A description will now be given of an experiment conducted by the inventors. FIG. 2 is a cross-sectional view of a sample used in the experiment.

Referring to FIG. 2, the AlN layer 4 having a thickness T1 of 300 nm is formed on the substrate 2 made of silicon. The AlN layer 4 is grown by the MOCVD method. The source material of the AlN layer 4 includes TMA (trimethylaluminum) having a Ga content of 0.1 ppm or less for Al, and $NH_3$ having a degree of purity of 99.9999% or more. The feed rate of TMA is 10 μmol/min, the growth temperature is 1050° C., the flow rate of $NH_3$ is 0.5 mol/min, and the growth pressure is 200 torr. F The experiment uses two types of samples. Sample A is formed by successively forming the AlN layer and the GaN-based semiconductor layers. Sample B is formed by separately performing the step of forming the AlN layer and the step of the GaN-based semiconductor layers and by cleaning the MOCVD apparatus between the two steps. The following are the contents and results of the experiment.

Figure 3:
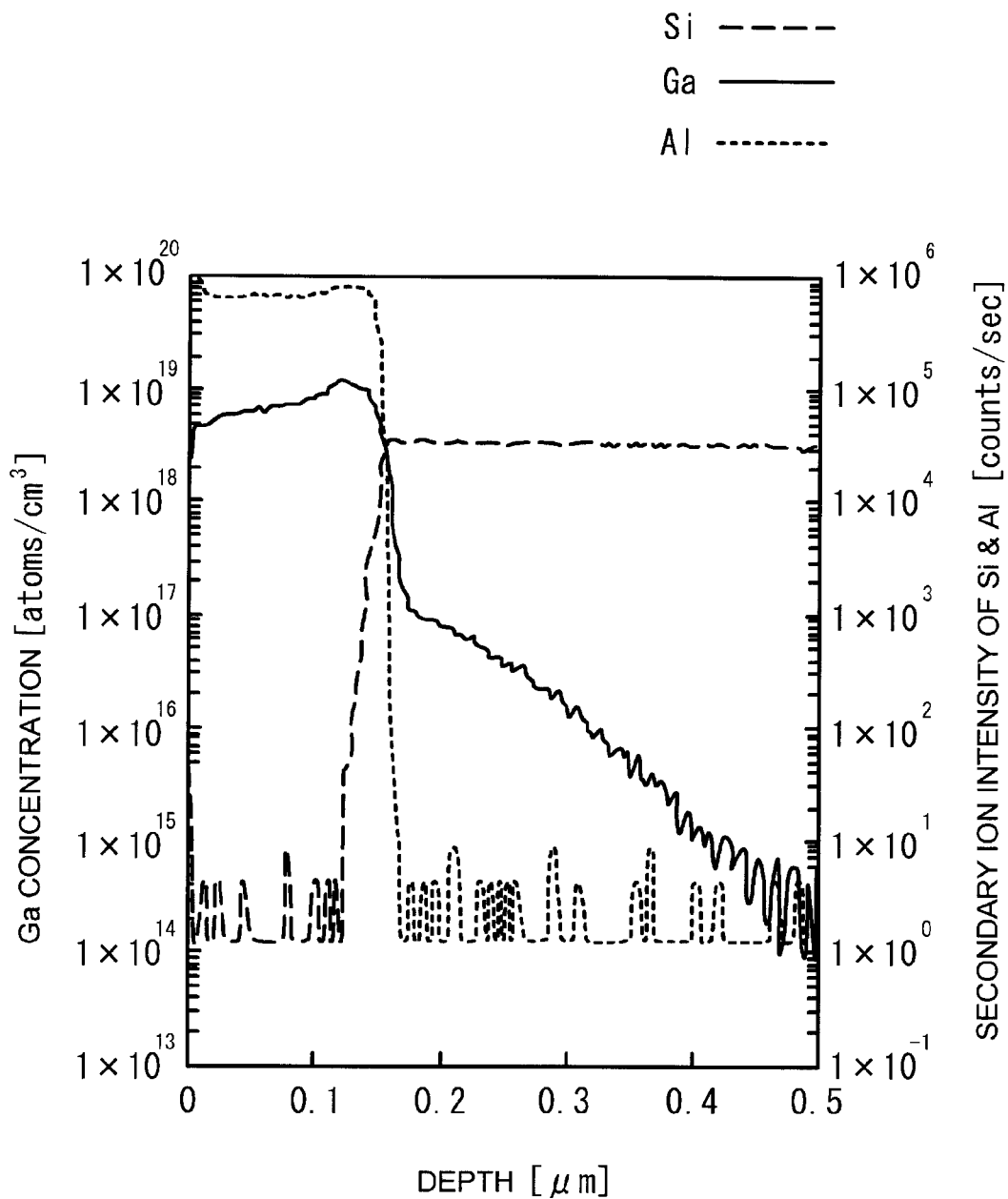
FIG. 3 illustrates a result of a SIMS analysis of sample A.
Figure 4:
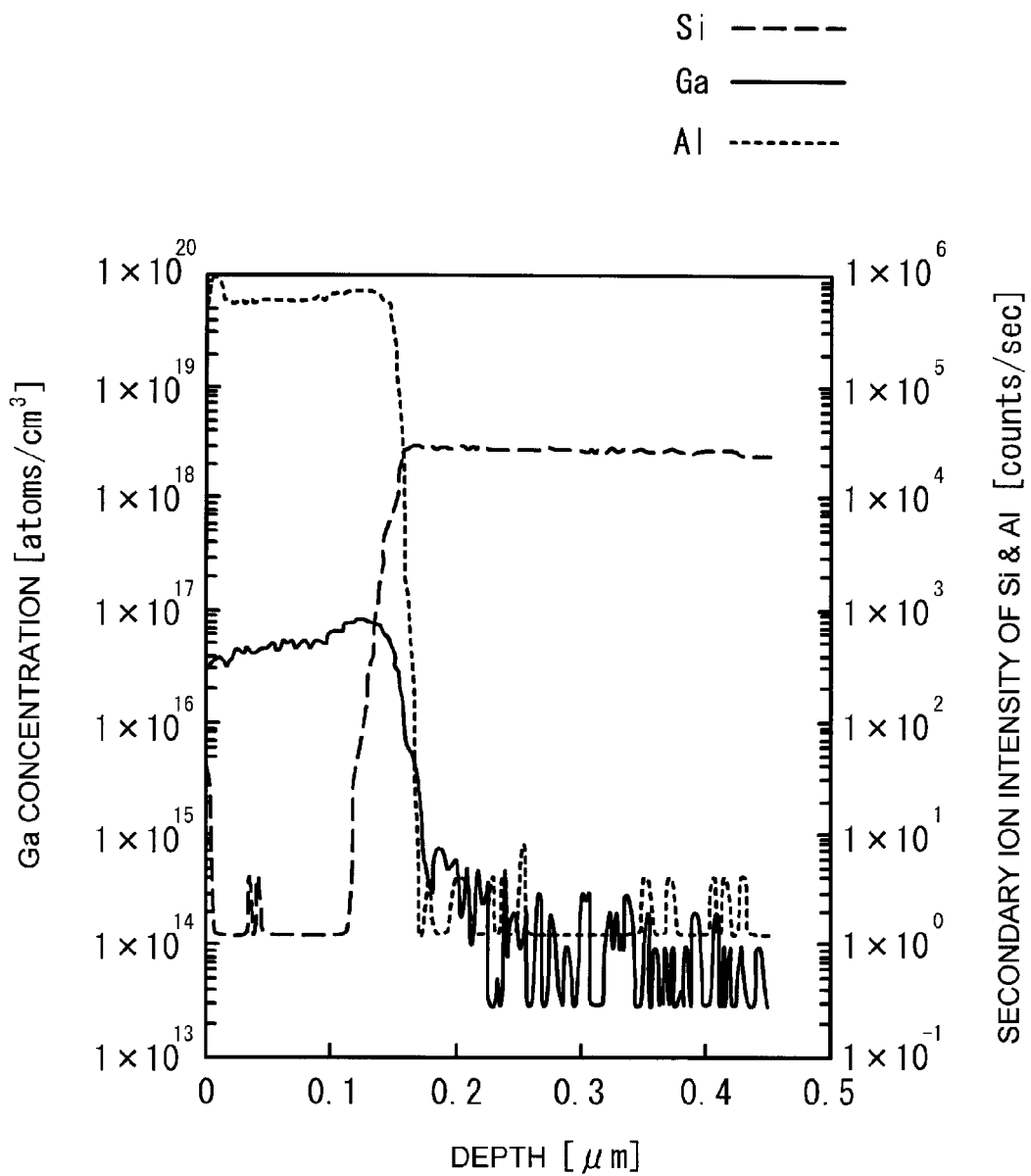
FIG. 4 illustrates a result of a SIMS analysis of sample B.

In the experiment, the samples A and B were subjected to a SIMS (Secondary Ion Mass Spectrometry) analysis. FIG. 3 illustrates a result of the SIMS analysis of the comparative example, and FIG. 4 illustrates a result of the SIMS analysis of a first embodiment, which will be described later. In FIGS. 3 and 4, the horizontal axis denotes the depth from the surface, the left-hand side vertical axis denotes the concentration of Ga, and the right-hand side vertical axis denotes secondary ion intensities of Si and Al.

Referring to FIG. 3, a region having a high Al concentration (in a depth of 0 to about 0.17 μm) is the AlN layer 4. A region having an almost constant silicon concentration (deeper than 0.17 μm) is the silicon substrate 2. As illustrated in FIG. 3, the Ga concentration in the AlN layer 4 is $1 \times 10^{19}$ atoms/cm$^3$. This may be because the remaining Ga in the MOCVD apparatus is entrapped in, and then diffuses in the AlN layer 4 during growing. The Ga concentration in the silicon substrate 2 has the following profile. The Ga concentration in the silicon substrate 2 is $1 \times 10^{17}$ atoms/cm$^3$ at the interface between the silicon substrate 2 and the AlN layer 4, and gradually decreases as the distance from the AlN layer 4 increases. The profile of gradually decreasing defines a region that functions as the conductive layer 3 (see FIG. 1).

Referring to FIG. 4, a region having a high Al concentration (in a depth of 0 to 0.14 μm) is the AlN layer 4. A region having an almost constant silicon concentration (deeper than 0.14 μm) is the substrate 2. As illustrated in FIG. 4, the concentration of Ga in the AlN layer 4 is reduced to about $9 \times 10^{16}$ atoms/cm$^3$. The Ga concentration decreases abruptly in the vicinity of the interface between the silicon substrate 2 and the AlN layer 4, and the concentration of Ga in the silicon substrate reduces greatly. This shows that the sample B is improved to have the reduced conductive layer 3 (see FIG. 1). It may be understood that the fact that Ga is detected in the AlN layer 4 in FIG. 4 results from a situation in which remaining Ga is mixed in the AlN layer 4 during the step of reducing the quantity of Al.

As described above, forming of the AlN layer 4 on the silicon substrate using the growth apparatus from which Ga has been removed brings about the effect of reducing the concentration of Ga in the AlN layer 4 and restrains forming of the conductive layer 3.

Embodiments of the present invention are now described with reference to the accompanying drawings.

First Embodiment

Figure 5:
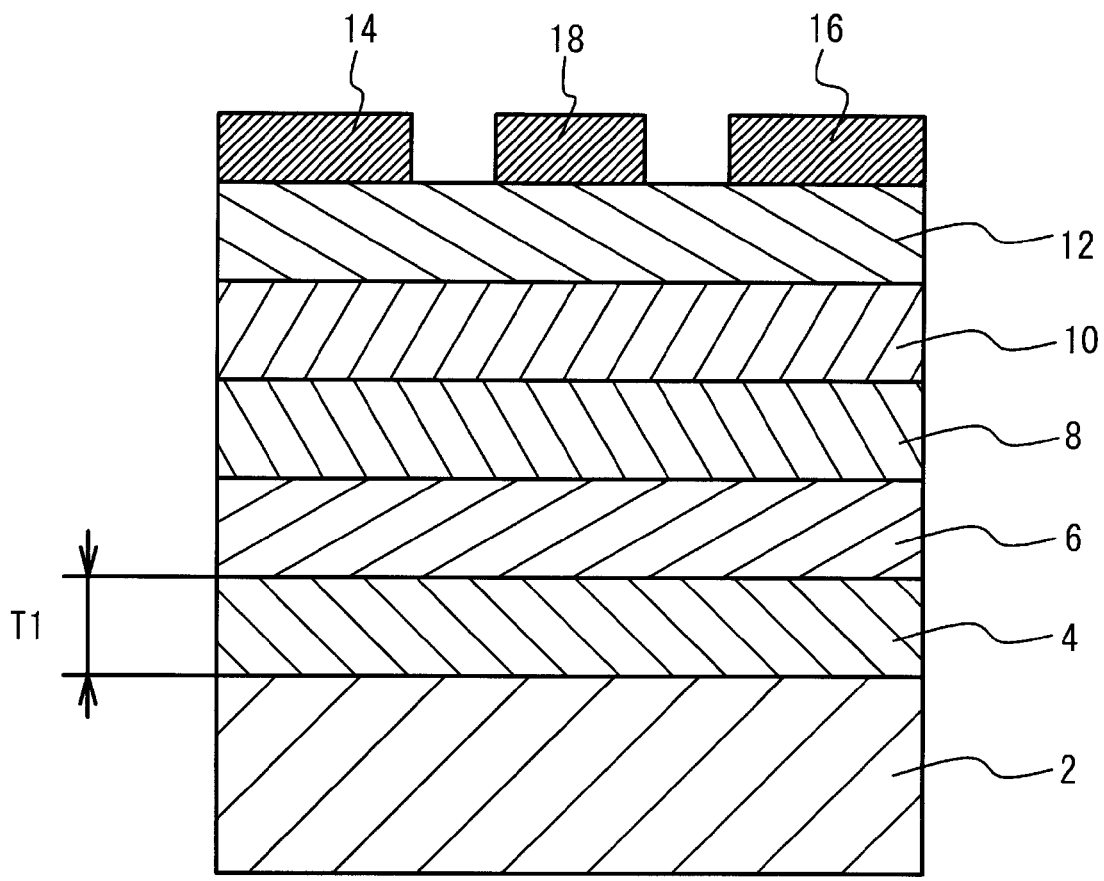
FIG. 5 is a cross-sectional view of a semiconductor device in accordance with a first embodiment.

A semiconductor device in accordance with the first embodiment is now described. FIG. 5 is a cross-sectional view of a semiconductor device in accordance with the first embodiment, in which parts that are the same as those illustrated in FIG. 1 are given the same reference numerals.

Referring to FIG. 5, the AlN layer 4 is formed on the substrate 2 made of silicon. The AlN layer 4 does not include Ga as a composition element and has a Ga impurity concentration of $2 \times 10^{18}$ atoms/cm$^3$ or less. The AlGaN layer 6, which is a nitride semiconductor having Ga as a composition element, is formed on the AlN layer 4. The conductive layer 3 (see FIG. 1) containing Ga is not formed in the substrate 2.

Figure 6:
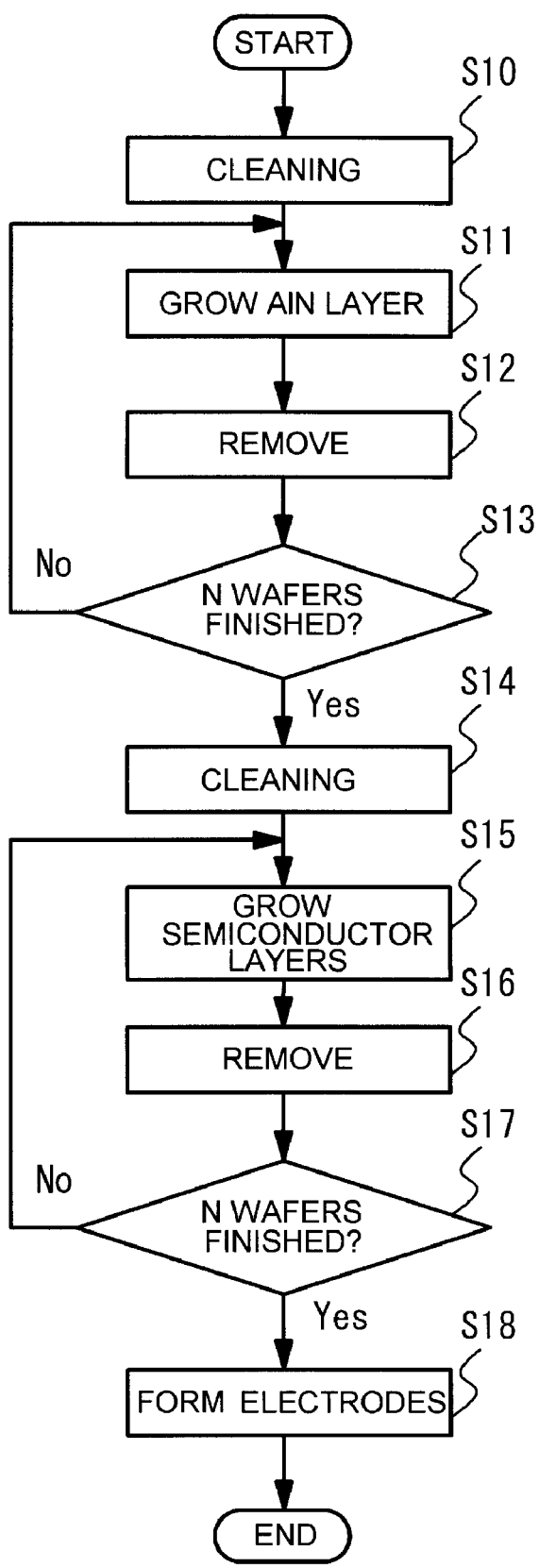
FIG. 6 is a flowchart describing a method for fabricating the semiconductor device in accordance with the first embodiment.

A description is now given of a method for fabricating the semiconductor device in accordance with the first embodiment. FIG. 6 is a flowchart of the method in accordance with the first embodiment.

Referring to FIG. 6, the process commences with a step of cleaning the inside of the MOCVD apparatus (step S10). Examples of the step of cleaning are as follows. A reaction tube to which Ga is deposited prior to cleaning is cleaned by etching. Parts of the MOCVD apparatus are replaced with new ones. Baking is carried out at 1150° C. in the flow of $N_2$ or $O_2$. Baking removes impurities including a group 3 element such as Ga deposited to a jig, chamber and acceptor of the MOCVD apparatus and realizes a condition in which the impurities are removed as much as possible. The temperature selected in baking is preferably higher than the temperatures at which the AlN layer 4 and the GaN-based semiconductor layers are grown.

After step S10, a wafer made of silicon is loaded to the MOCVD apparatus that has been cleaned. Then, the AlN layer 4 having the thickness T1 equal to, for example, 300 nm is formed on the wafer. The feed rate of TMA at that time is, for example, 10 μmol/min. In other words, the AlN layer 4 (first layer) that does not include Ga as a composition element, and has a Ga impurity concentration of $2 \times 10^{18}$ atoms/cm$^3$ or less is formed on the silicon substrate 2 (step S11). Thus, a structure similar to that illustrated in FIG. 2 is obtained.

After step S11, the wafer is removed from the MOCVD apparatus (step S12). That is, the wafer on which the AlN layer 4 is formed as illustrated in FIG. 2 is removed from the MOCVD apparatus. For example, the substrate 2 and the AlN 4 are exposed to the atmosphere.

After step S12, it is determined whether the AlN layer 4 has been formed on a predetermined number N of wafers (step S13). If the answer of step S13 is NO, the process returns to step S11. That is, the step of forming the AlN layer 4 on the silicon substrate 2 is repeatedly carried out.

When the answer of step S13 is YES, the process proceeds to step S14 at which the MOCVD apparatus is cleaned as a preprocess. The way of cleaning is the same as that employed at step S10.

After step S14, the wafer that has been subjected to steps S11 and S12 is loaded to the MOCVD apparatus used at step S11, and the GaN-based semiconductor layers (second layer as a whole) are formed at step S15. The second layer includes Ga as a composition element and includes the AlGaN layer 6, the GaN layer 8, the AlGaN layer 10 and the GaN layer 12. One of the GaN-based semiconductor layers is formed so as to contact the AlN layer 4. The growth condition for each layer is as follows.

The source material of the AlGaN layer 6 is TMG (trimethylgallium) and TMA. The feed rates of TMG and TMA are both 10 μmol/min, for example. The AlGaN layer 6 has a thickness of, for example, 300 nm. The source material of the GaN layer 8 is TMG, and the feed rate is, for example, 120 μmol/min. The GaN layer 8 has a thickness of, for example, 1000 nm. The source material of the AlGaN layer 10 is TMG and TMA, and the feed rates thereof are, for example, 25 μmol/min and 5 μmol/min, respectively. The AlGaN layer 10 has a thickness of, for example, 20 nm. The source material of the GaN layer 12 is TMG, and the feed rate thereof is, for example, 25 μmol/min. The GaN layer 12 has a thickness of, for example, 5 nm. The growth of the AlN layer 4 uses TMA having a Ga content of 0.1 ppm or less for Al, and NH$_3$ having a degree of purity of 99.9999% or more. The AlN layer 4 has a thickness of, for example, 150 nm.

After step S15, the wafer is removed from the MOCVD apparatus (step S16). Then, it is determined whether the GaN-based semiconductor layers have been formed on a predetermined number N of wafers (step S17). If the answer of step S17 is NO, the process returns to step S15. That is, the step of forming the GaN-based semiconductor layers on the AlN layer 4 is repeatedly carried out.

After step S17, the source electrode 14, the drain electrode 16 and the gate electrode 18 are formed on the GaN layer 12 (step S18). Though the above steps, the semiconductor device of the first embodiment is fabricated.

According to the first embodiment, as illustrated in FIG. 6, the step of forming the AlN layer 4 and the step of forming the GaN-based semiconductor layers are separated from each other. After the step of forming the AlN layer 4 is repeatedly carried out multiple times, the step of the GaN-based semiconductor layers is carried out. It is thus possible to prevent an impurity including Ga from remaining in the MOCVD apparatus prior to the step of forming the AlN layer 4. It is thus possible to restrain entrapment of Ga in the AlN layer 4 during the step of growing the AlN layer 4. Thus, the conductive layer 3 illustrated in FIG. 1 is not formed in the silicon substrate 2.

It is possible to restrain entrapment of group 3 element other than Ga in the AlN layer 4. It is thus possible to keep the resistance of the silicon substrate 2 high and prevent the characteristics of the semiconductor device from being deteriorated.

The GaN-based semiconductor is a semiconductor that includes Ga and N. The GaN-based semiconductor is not limited to GaN and AlGaN described above but includes other semiconductors such as InGaN and InAlGaN. The first layer may be a nitride semiconductor other than AlN. The nitride semiconductor does not include Ga as a composition element and has a Ga impurity concentration of $2 \times 10^{18}$ atoms/cm$^3$ or less.

The thickness T1 of the AlN layer 4 is not limited to 300 nm. For example, when T1 is set equal to 200 nm, the AlN layer 4 can prevent the occurrence of a crack and functions as the buffer layer.

Second Embodiment

Figure 7:
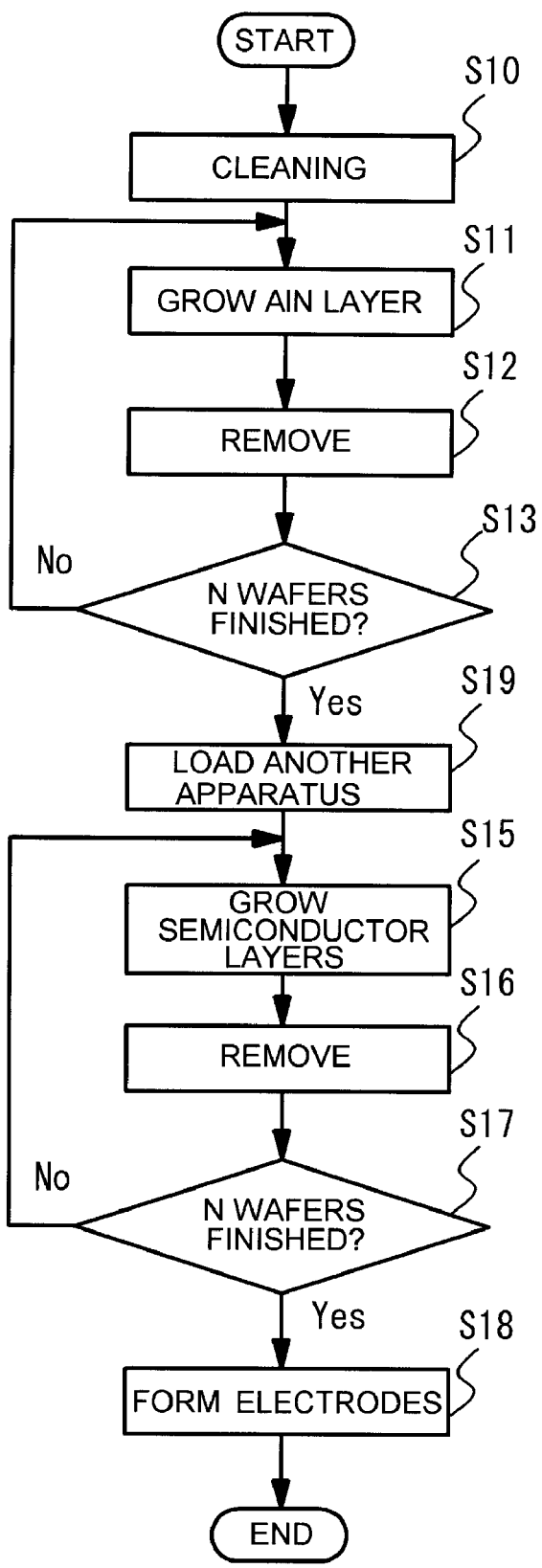
FIG. 7 is a flowchart describing a method for fabricating a semiconductor device in accordance with a second embodiment.

FIG. 7 is a flowchart of a method for fabricating a semiconductor device in accordance with a second embodiment.

Referring to FIG. 7, the process commences with a step of cleaning the inside of the MOCVD apparatus (step S10). This cleaning may be ordinary cleaning prior to growth and is thus different from the cleaning at step S10 in FIG. 6. Next, the AlN layer 4 is grown at step S11 and the wafer is removed from the MOCVD apparatus. At step S13, the steps S11 and S12 are repeatedly carried out until a predetermined number N of wafers has been processed. Steps S12 and S13 in FIG. 7 are the same as those in FIG. 6.

At step S19 that follows step S12, the wafer is loaded to another MOCVD apparatus that is different from the MOCVD apparatus used at step S11. Step S19 is followed by steps S15-S18 as in the case of FIG. 6. The GaN-based semiconductor layers are grown by the MOCVD apparatus that is different from that used to grow the AlN layer 4.

According to the second embodiment, the step of forming the AlN layer 4 (step S11) and the step of forming the GaN-based semiconductor layers are carried out separately, and use the different MOCVD apparatuses. It is thus possible to restrain impurities including Ga from being mixed in the MOCVD apparatus and restrain Ga from being entrapped in the AlN layer 4 during the step of growing the AlN layer 4. It is thus possible to depress the forming of the conductive layer including Ga at the interface between the silicon substrate 2 and the AlN layer 4 and to restrain deterioration of the device characteristics.

The AlN layer 4 and the GaN-based semiconductor layers may be formed concurrently by using the respective MOCVD apparatuses. Thus, speedup of the fabrication process is realized. The AlN layer 4 and the GaN-based semiconductor layers may be formed by a method other than the MOCVD method. In order to remove impurities, it is preferable that the MOCVD apparatus used to grow the GaN-based semiconductor layers is cleaned prior to step S15.

Third Embodiment

Figure 9A:
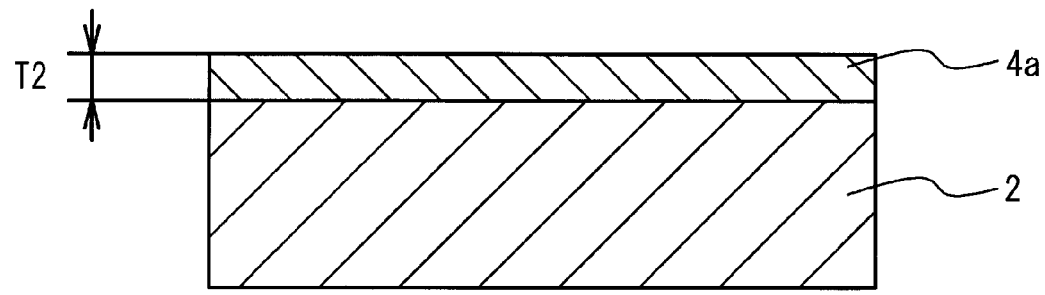
FIGS. 9A and 9B are cross-sectional views of the semiconductor device in accordance with the third embodiment.

FIG. 3 is a flowchart of a method for fabricating a semiconductor device in accordance with a third embodiment. FIG. 9A is a cross-sectional view of a structure of the semiconductor device available after step S11 is performed, and FIG. 9B is a cross-sectional view of a structure of the semiconductor device available after step S18 is performed.

Figure 8:
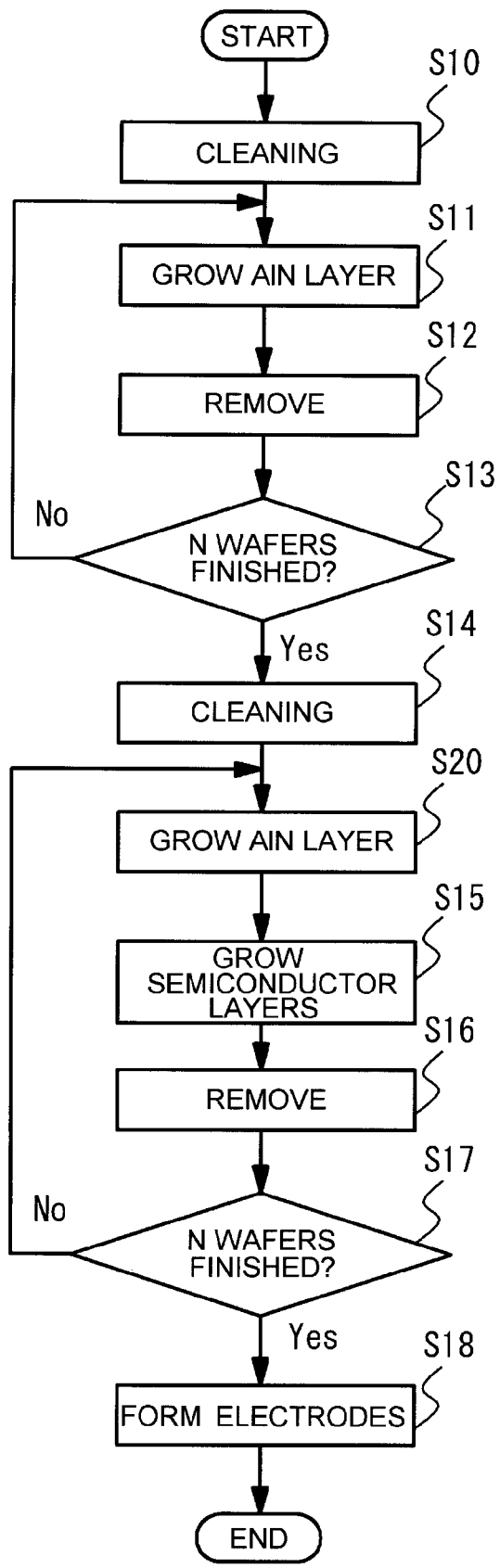
FIG. 8 is a flowchart describing a method for fabricating a semiconductor device in accordance with a third embodiment.

Referring to FIG. 8, after step S10 is carried out, an AlN layer 4a (first layer) that does not include Ga as a composition element and a Ga impurity concentration of $2\times10^{18}$ atoms/cm$^3$ or less is formed on the silicon substrate 2 (step S11).

Figure 9B:
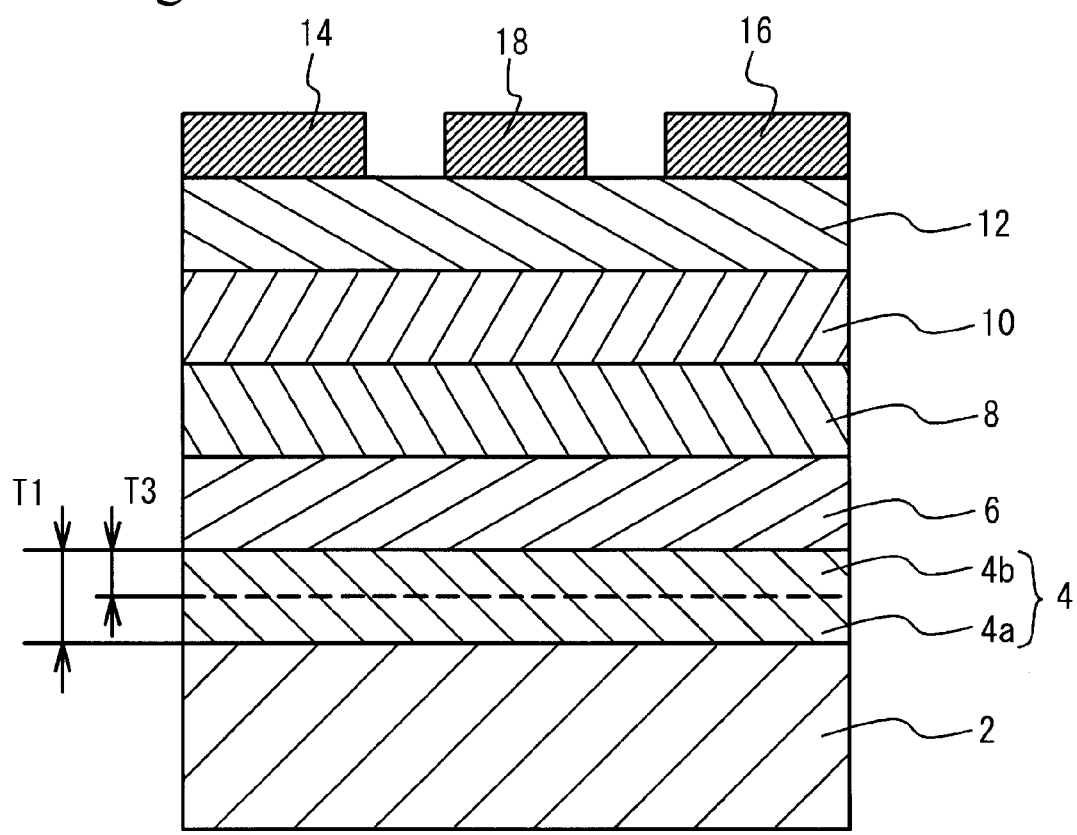

Referring to FIG. 9A, the AlN layer 4a has a thickness T2 of, for example, 150 nm, which may be half the thickness T1 of the AlN layer obtained in the complete semiconductor device (see FIG. 5 and FIG. 9B).

After step S11, the wafer on which the AlN layer 4a is formed as illustrated in FIG. 9A is removed from the MOCVD apparatus (step S12). For example, the silicon substrate 2 and the AlN layer 4a are exposed to the atmosphere. Then, steps S13 and S14 are carried out. Steps S10 through S14 are the same as those illustrated in FIG. 6.

After step S14, an AlN layer 4b (third layer) is formed on the AlN layer 4a (step S20) so as to contact the AlN layer 4a. The AlN layer 4b has a thickness T3 of, for example, 150 nm, and does not include Ga as a composition element. The AlN layer 4b has a Ga impurity concentration of $2\times10^{18}$ atoms/cm$^3$ or less.

After the step S20, the GaN-based semiconductor layers are formed on the AlN layer 4b (step S15). Steps S16 through S18 that follow step S15 are the same as those illustrated in FIG. 6. Through the above-described steps, the semiconductor device illustrated in FIG. 9B is completed. The AlN layers 4a and 4b form the AlN layer 4 having a thickness T1 of, for example, 300 nm. The conditions for growing the layers are as follows.

The source material of the AlN layer 4a and that of the AlN layer 4b are TMA, and the feed rate thereof is 10 μmol/min. Each of the AlN layers 4a and 4b is 150 nm thick, for example. The source material of the AlGaN layer 6 is TMG and TMA, and the feed rates thereof are 10 μmol/min. The thickness of the AlGaN layer 6 is, for example, 300 nm. The source material of the GaN layer 8 is TMG, and the feed rate thereof is, for example, 120 μmol/min. The GaN layer 8 is 1000 nm thick, for example. The source material of the AlGaN layer 10 is TMG and TMA, and the feed rates thereof are 25 μmol/min and 5 μmol/min, respectively. The AlGaN layer 10 is 20 nm thick, for example. The source material of the GaN layer 12 is TMG, and the feed rate thereof is 25 μmol/min. The GaN layer 12 is 5 nm thick, for example. The GaN layer 12 has a thickness of, for example, 5 nm. The growth of the AlN layer 4 uses TMA having a Ga content of 0.1 ppm or less for Al, and NH$_3$ having a degree of purity of 99.9999% or more. The AlN layer 4 has a thickness of, for example, 150 nm.

According to the third embodiment, the step of forming the AlN layer 4a (step S20) and the step of forming the GaN-based semiconductor layers (step S15) are separated from each other, as in the case of the first embodiment. After the step of forming the AlN layer 4a is repeatedly carried out multiple times, the step of the GaN-based semiconductor layers is carried out. It is thus possible to prevent an impurity including Ga from remaining in the MOCVD. It is thus possible to prevent the conductive layer 3 including Ga from being formed at the interface between the silicon substrate 2 and the AlN layer 4 and illustrated in FIG. 1 is not formed in the silicon substrate 2.

Figure 10:
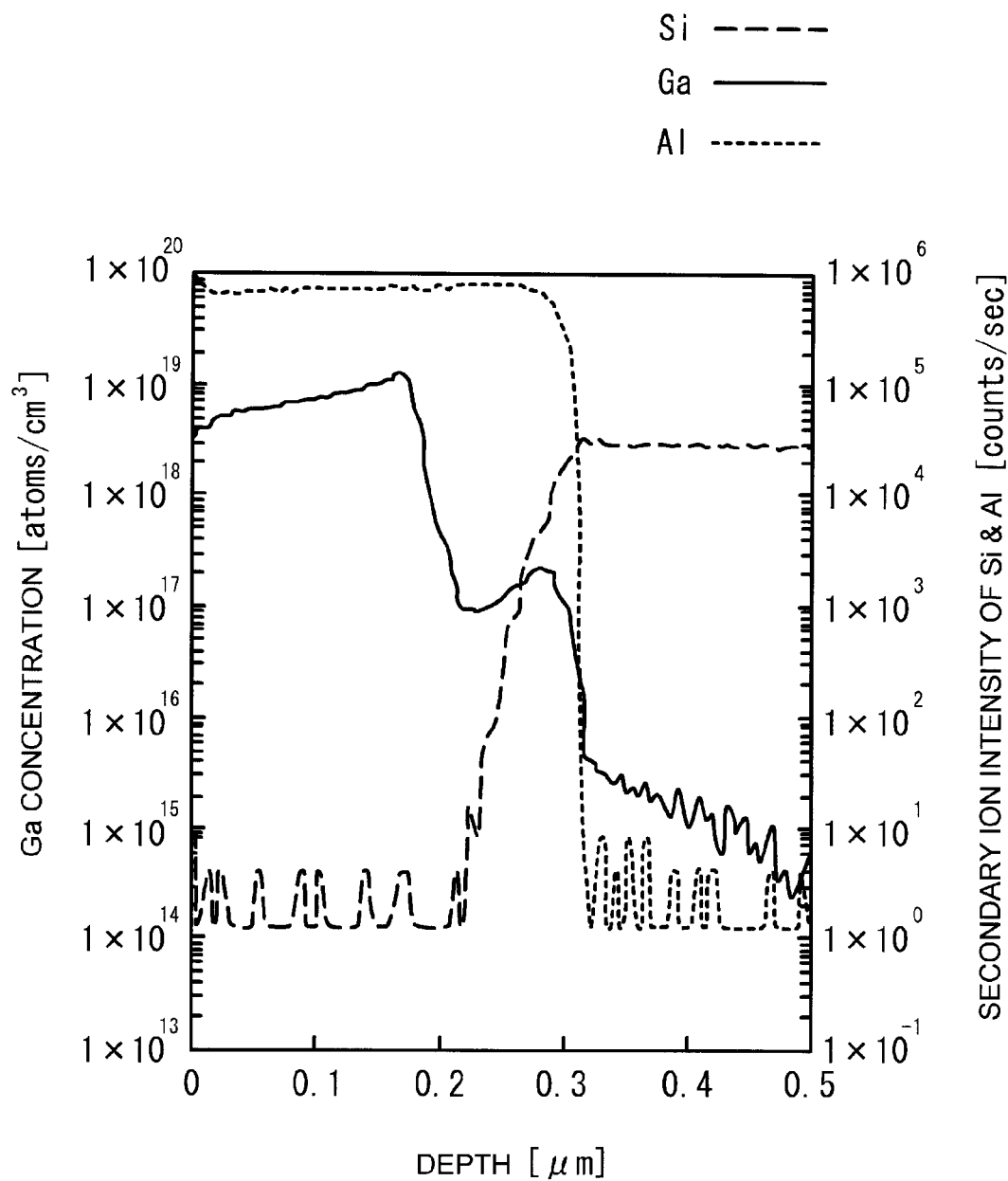
FIG. 10 illustrates a result of a SIMS analysis of the third embodiment.

FIG. 10 is a graph that illustrates a result of the SIMS analysis of the third embodiment in the state in which the growth of the AlN layer 4b is completed. A region having a high Ga concentration in a depth of 0 to 0.17 μm is the AlN layer 4b, and another region having a decreasing Ga concentration in a depth of 0.17 to 0.3 μm is the AlN layer 4a. A further region having an almost constant silicon concentration (deeper than 0.3 μm) is the silicon substrate 2.

As illustrated in FIG. 10, the Ga concentration in the AlN layer 4b is approximately $1\times10^{19}$ atoms/cm$^3$, while the Ga concentration in the AlN layer 4a is approximately $2\times10^{17}$ atoms/cm$^3$. The Ga concentration in the vicinity of the interface between the silicon substrate 2 and eth AlN layer 4a is approximately $1\times10^{16}$ atoms/cm$^3$, and decreases abruptly in the depth direction. Since the AlN layer 4b is grown by the MOCVD apparatus used to grow the layers including Ga, the Ga concentration is relatively high. However, the Ga concentration in the AlN layer 4a is decreased. Thus, it may be understood that the AlN layer 4a functions to restrain the diffusion of Ga.

It is to be noted that there is a difference in thermal expansion coefficient between the silicon substrate 2 and the AlN layer 4. If the AlN layer 4 is too thick, the silicon substrate 2 may be warped and the AlN layer 4 may crack when the wafer is removed from the MOCVD apparatus and the silicon substrate 2 and the AlN layer 4 are exposed to the atmosphere.

According to the third embodiment, the AlN layer 4a that is thinner than the AlN layer 4 in the complete semiconductor device, and is then removed from the MOCVD apparatus (steps S11 and S12). The step of forming the AlN layer 4b and the step of forming the GAN-based semiconductor layers are successively carried out. For example, the AlN layer 4b is formed, and the GaN-based semiconductor layers are formed without the silicon substrate 2 and the AlN layer 4b being exposed to the atmosphere. It is thus possible to restrain warpage or crack from occurring in the AlN layer 4.

After the AlN layer 4a is formed, the AlN layer 4b is formed on the AlN layer 4a (step S2). Thus, the AlN layer having a sufficient thickness that enables the AlN layer to function as the buffer layer is formed on the silicon substrate 2. The third layer is not limited to the AlN layer but may be anther nitride semiconductor that does not include Ga as a composition element and has a Ga impurity concentration of $2\times10^{18}$ atoms/cm$^3$ or less.

The thickness T2 of the AlN layer 4a is not limited to 150 nm. In terms of suppression of crack, it is preferable to use a thinner AlN layer. For example, when the thickness T2 is 100 nm or less, it is possible to more effectively suppress crack. More particularly, the thickness T2 is 50 nm or less. In case where the AlN layer 4a is too thin, there is a difficulty in growing the AlN layer 4a. Thus, it is preferable to set the thickness T2 equal to or more than 10 nm. Although the thickness T3 of the AlN layer 4b is not limited to 150 nm in the foregoing, it may be changed appropriately taking the thickness T2 of the AlN layer 4a into consideration. In order to enable the AlN layer 4 to function as the buffer layer, the thickness T3 is preferably more than 150 nm. When the thickness T3 is 200 nm or more, the buffer layer having a sufficient thickness is available.

As in the case of the second embodiment, the third embodiment may be varied so that the step of forming the AlN layer 4a and the step of forming the GaN-based layers are carried out by the separate MOCVD apparatuses.

Figure 11:
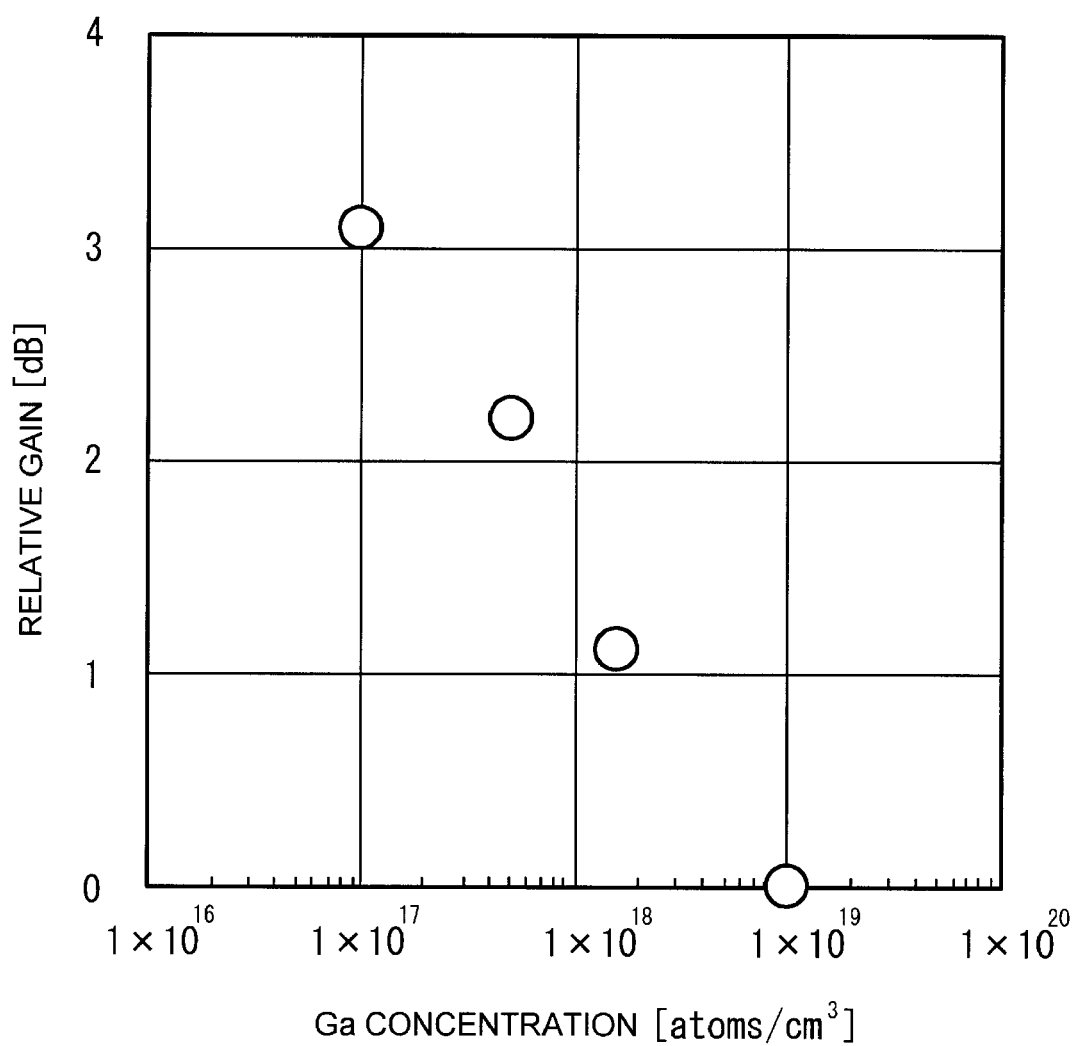
FIG. 11 illustrates a result of gain evaluation of semiconductor devices.

FIG. 11 is a graph that illustrates a result of gain evaluation of the semiconductor device configured in accordance with the first embodiment. In the gain evaluation, several semiconductor devices having the following different substrates are prepared. The substrates are prepared by changing the degree of cleaning (step S10 in FIG. 6) and changing the concentration of Ga in the AlN layer 4. On the different substrates, the semiconductor layers and the electrodes are formed. Then, the gains of the semiconductor devices thus prepared are measured. In FIG. 11, the horizontal axis denotes the concentration of Ga in the AlN layer 4, and the vertical axis denotes a relative gain obtained by normalizing the gain with respect to the gain of the comparative example (see FIG. 1).

As illustrated in FIG. 11, when the concentration of Ga in the AlN layer 4 is equal to or close to $2\times10^{18}$ atoms/cm$^3$, the gain of the first embodiment is about 1 dB better than that of the comparative example. Similarly, when the concentration of Ga in the AlN layer 4 is equal to or close to $5\times10^{17}$ atoms/cm$^3$, the gain of the first embodiment is about 2 dB better than that of the comparative example. When the concentration of Ga in the AlN layer 4 is equal to or close to $1\times10^{17}$ atoms/cm$^3$, the gain of the first embodiment is about 3 dB better than that of the comparative example. It can be seen that the Ga concentration is preferably set equal to or less than $2\times10^{18}$ atoms/cm$^3$ in order to obtain an improvement equal to or more than 1 dB with respect to the comparative example.

In order to realize a Ga concentration of $2\times1018$ atoms/cm3 or less, the impurity of the source material of Al used to grow the AlN layer. It is preferable that the content of Ga to Al in the organic source material of Al such as TMA is equal to or less than 2 ppm in order to form the AlN layer 4 by the MOCVD method. In order to form the AlN layer 4 by the MBE method, it is preferable that the content of Ga to Al in the source material of Al used in the MBE method is equal to or less than 40 ppm.

In a case where the concentration of Ga in the AlN layer 4 is set approximately equal to $5\times1017$ atoms/cm3 and the MOCVD method is employed, it is preferable that the content of Ga to Al in the organic source material of Al is equal to or less than 0.5 ppm. When the MBE method is employed, the content of Ga to Al of the source material is preferably equal to or less than 10 ppm.

In a case where the concentration of Ga in the AlN layer 4 is set approximately equal to $1\times1017$ atoms/cm3 and the MOCVD method is employed, it is preferable that the content of Ga to Al in the organic source material of Al is equal to or less than 0.1 ppm. When the MBE method is employed, the content of Ga to Al of the source material is preferably equal to or less than 2 ppm.

The semiconductor devices of the above-described embodiments are not limited to HEMTs but may be FETs. Particularly, high-frequency devices configured in accordance with the aspects of the present invention are capable of restraining deterioration of the characteristics due to leakage path or parasitic capacitance. The method for growing the layers is not limited to MOCVD and MBE but may be HVPE, which use the MOCVD apparatus, the MBE apparatus and the HVPE apparatus, respectively.

The present invention is not limited to the specifically described embodiments and embodiments, but may include other embodiments and variations without departing from the scope of the present invention.

What is claimed is:

1. A method for fabricating a semiconductor device comprising:
   cleaning an apparatus used to grow a layer including Ga;
   performing a first step of forming a first layer on a substrate made of silicon by using the apparatus, the first layer including a nitride semiconductor that does not include Ga as a composition element and has a Ga impurity concentration of $2\times10^{18}$ atoms/cm$^3$ or less; and
   performing a second step of forming a second layer on the first layer by using the apparatus after the first step is repeatedly carried out multiple times, the second layer including a nitride semiconductor including Ga.

2. The method according to claim 1, further comprising performing a third step of forming a third layer on the first layer by using the apparatus after the first step is carried out and before the second step is carried out, the third layer not having Ga as a composition element, wherein the second step and the third step are successively carried out, and the second layer is formed on the third layer.

3. The method according to claim 2, wherein the third layer is 150 nm or less.

4. The method according to claim 2, wherein the third layer is made of composition elements identical to those of the first layer.

5. The method according to claim 1, wherein the first layer comprises AlN.

6. The method according to claim 1, wherein the second layer comprises at least one of GaN, InGaN, AlGaN and InAlGaN.

7. The method according to claim 1, wherein the apparatus is one of an HVPE apparatus, an MOCVD apparatus, and an MBE apparatus.

8. The method according to claim 1, wherein the apparatus used in the first step is an MOCVD apparatus, and a content of Ga to Al in an organic source material of Al is 2 ppm or less.

9. The method according to claim 1, wherein the apparatus used in the first step is an MBE apparatus, and a content of Ga to Al in an organic source material of Al is 40 ppm or less.

10. The method according to claim 1, wherein the first layer is 200 nm or less.

11. A method for fabricating a semiconductor device comprising:
    performing a first step of forming a first layer on a substrate made of silicon by using an apparatus, the first layer including a nitride semiconductor that does not include Ga as a composition element and has a Ga impurity concentration of $2\times10^{18}$ atoms/cm$^3$ or less; and
    performing a second step of forming a second layer on the first layer by using another apparatus, the second layer including a nitride semiconductor including Ga.

12. The method according to claim 11, further comprising a third step of forming a third layer on the first layer by using the another apparatus after the first step is carried out and before the second step is carried out, the third layer not having Ga as a composition element, wherein the second step and the third step are successively carried out, and the second layer is formed on the third layer.

13. The method according to claim 12, wherein the third layer is 150 nm or less.

14. The method according to claim 12, wherein the third layer is made of composition elements identical to those of the first layer.

15. The method according to claim 11, wherein the first layer comprises AlN.

16. The method according to claim 11, wherein the second layer comprises at least one of GaN, InGaN, AlGaN and InAlGaN.

17. The method according to claim 11, wherein the apparatus is one of an HVPE apparatus, an MOCVD apparatus, and an MBE apparatus.

18. The method according to claim 11, wherein the apparatus used in the first step is an MOCVD apparatus, and a content of Ga to Al in an organic source material of Al is 2 ppm or less.

19. The method according to claim 11, wherein the apparatus used in the first step is an MBE apparatus, and a content of Ga to Al in an organic source material of Al is 40 ppm or less.

20. The method according to claim 11, wherein the first layer is 200 nm or less.

* * * * *

UNITED STATES PATENT AND TRADEMARK OFFICE
CERTIFICATE OF CORRECTION

PATENT NO. : 7,947,578 B2
APPLICATION NO. : 12/750011
DATED : May 24, 2011
INVENTOR(S) : Isao Makabe et al.

It is certified that error appears in the above-identified patent and that said Letters Patent is hereby corrected as shown below:

Title page, Item (75), Inventor name;
Change
"Tsuyoshi Kouichi

To be

--Tsuyoshi Kouchi--

Signed and Sealed this
Second Day of August, 2011

David J. Kappos
*Director of the United States Patent and Trademark Office*